(12) United States Patent
Lai et al.

(10) Patent No.: US 7,750,481 B2
(45) Date of Patent: Jul. 6, 2010

(54) DIE OFFSET DIE TO DIE BONDING

(75) Inventors: Nguk Chin Lai, Penang (MY); Kevin Guan, Richmond, CA (US); Kwet Nam Wong, Penang (MY); Cheng Sim Kee, Penang (MY); Sally Foong, Milpitas, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/316,042

(22) Filed: Dec. 9, 2008

(65) Prior Publication Data

US 2009/0091043 A1    Apr. 9, 2009

Related U.S. Application Data

(62) Division of application No. 11/820,278, filed on Jun. 18, 2007, now Pat. No. 7,554,204.

(51) Int. Cl.
*H01L 23/48* (2006.01)
*H01L 23/52* (2006.01)
*H01L 29/40* (2006.01)

(52) U.S. Cl. .............................. 257/777; 257/E23.003

(58) Field of Classification Search .................. 438/107, 438/108; 257/686, 777
See application file for complete search history.

(56) References Cited

U.S. PATENT DOCUMENTS

| | | | |
|---|---|---|---|
| 6,215,182 B1 * | 4/2001 | Ozawa et al. | 257/723 |
| 6,514,794 B2 * | 2/2003 | Haba et al. | 438/109 |
| 6,593,662 B1 * | 7/2003 | Pu et al. | 257/777 |

* cited by examiner

*Primary Examiner*—David A Zarneke
*Assistant Examiner*—Jenny L Wagner

(57) ABSTRACT

A semiconductor die is provided on a spacer, the die having first and second opposite edges which extend beyond respective first and second opposite edges of the spacer, the first edge of the die extending beyond the first edge of the spacer to a lesser extent than the second edge of the die extends beyond the second edge of the spacer. Furthermore, a first semiconductor die has a plurality of bond pads thereon, a second semiconductor die has a plurality of bond pads thereon, and a substrate has a plurality of bond pads thereon. Each of a first plurality of wires connects a bond pad on the first semiconductor die with a bond pad on the second semiconductor die, and each of a second plurality of wires connects a bond pad on the second semiconductor die with a bond pad on the substrate.

5 Claims, 7 Drawing Sheets

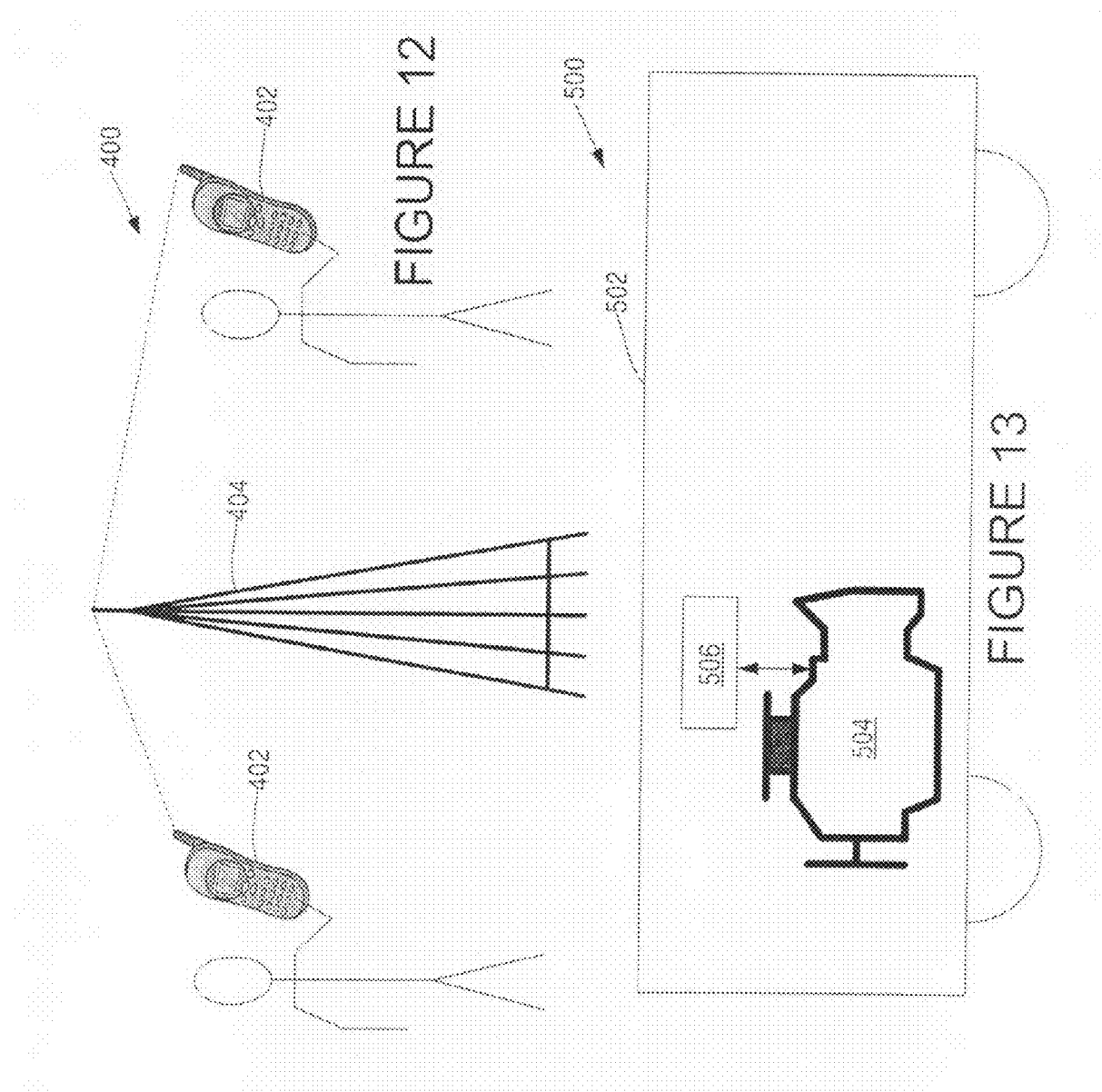

DIE OFFSET DIE TO DIE BONDING

This is a Divisional Application of U.S. patent application Ser. No. 11/820,278, entitled DIE OFFSET DIE TO DIE BONDING, filed Jun. 18, 2007, now U.S. Pat. No. 7,554,204 assigned to Spansion LLC.

BACKGROUND OF THE INVENTION

1. Technical Field

This invention relates generally to semiconductor devices which include a plurality of stacked semiconductor die, and more particularly, to constructing such a device with improved performance and yield.

2. Background Art

FIG. 1 illustrates a multi-die semiconductor device 40 (shown in simplified form), with the die in stacked relation. As shown in FIG. 1, a carrier substrate 42 has a chip attach surface 44. A semiconductor chip or die 46 is attached to the surface 44 of the substrate 42 by a die bond. A spacer 48 is attached to the die in stacked relation by a die bond, and a semiconductor die 50 is attached to the spacer 48 in stacked relation by a die bond. A semiconductor die 52 is attached to the die 50 in stacked relation by a die bond. Using standard wire bonding techniques, wires 53, 54, 55 connect bond pads 56, 58, 60 on the respective die 46, 50, 52 with bond pads 62 on the substrate 42.

As will be seen in FIG. 1, the spacer 48 is of smaller dimensions, i.e., smaller length and width, than the die 46 and the die 50, and the spacer 48 is centered on the die 46 therebelow and with relation to the die 50 thereon (see FIG. 2). This provides access to the bond pads 56 on the die 46 for wire bonding of the die 46 to the substrate 42. This also results in the die 50 on the spacer 48 overhanging the spacer 48 as shown. With the die 50 being relatively large (for high device performance), the overhang indicated as of dimension A can be relatively large. Connection of the wires 54 to the bond pads 58 on the die 50 involves a relative large impact (downward, FIG. 1) by the bonding head on the die 50 on that overhanging portion, which can cause the overhanging portion of the die 50 to bounce and vibrate. It will be seen that a large dimension A (resulting in turn in a large lever arm dimension B) as shown in FIG. 1 can result in a relatively large bounce, as the lever arm on which force is applied at the bond pads 58 on the die 50 is relatively large. This excessive bounce can result in imperfect wire bonding, in turn resulting in reduced yield of manufactured devices.

FIG. 3 illustrates another multi-die semiconductor device 60 (again shown in simplified form), with the die in stacked relation. As shown in FIG. 3, a carrier substrate 62 has a chip attach surface 64. A semiconductor chip or die 66 is attached to the surface 64 of the substrate 62 by a die bond. A semiconductor die 68 is attached to the die 66 in stacked relation by a die bond. Using standard wire bonding techniques, wires 70, 72 connect bond pads 74, 76 on the respective die 66, 68 with bond pads 78 on the substrate 62.

FIG. 4 is a plan view of the device of FIG. 3. As shown, the plurality of wires 70 connect the bond pads 74 on the die 66 with bond pads 78 on the substrate 62, the other plurality of wires 72 connect bond pads 76 on the die 68 with bond pads 78 on the substrate 62. Due to the complexity of the device, including the large number of bond pads on the die and substrate (much greater than the number illustrated), wire crossings occur (FIG. 4), resulting in increased likelihood of shorting and consequently failure of the device.

Therefore, what is needed is an approach wherein device yield is improved by reducing the bounce and shorting problems described above.

DISCLOSURE OF THE INVENTION

Broadly stated, the present electronic device comprises a body, and a semiconductor die on the body and having first and second opposite edges which extend beyond respective first and second opposite edges of the body, the first edge of the die extending beyond the first edge of the body to a lesser extent than the second edge of the die extends beyond the second edge of the body.

Broadly stated, the present electronic device comprises a first semiconductor die having a plurality of bond pads thereon, a second semiconductor die having a plurality of bond pads thereon, a substrate having a plurality of bond pads thereon, a first plurality of wires, each connecting a bond pad on the first semiconductor die with a bond pad on the second semiconductor die, and a second plurality of wires, each connecting a bond pad on the second semiconductor die with a bond pad on the substrate.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 12-14 illustrate systems incorporating the present devices.

BEST MODE(S) FOR CARRYING OUT THE INVENTION

Reference is now made in detail to specific embodiments of the present invention which illustrate the best mode presently contemplated by the inventors for practicing the invention.

Figure 1:
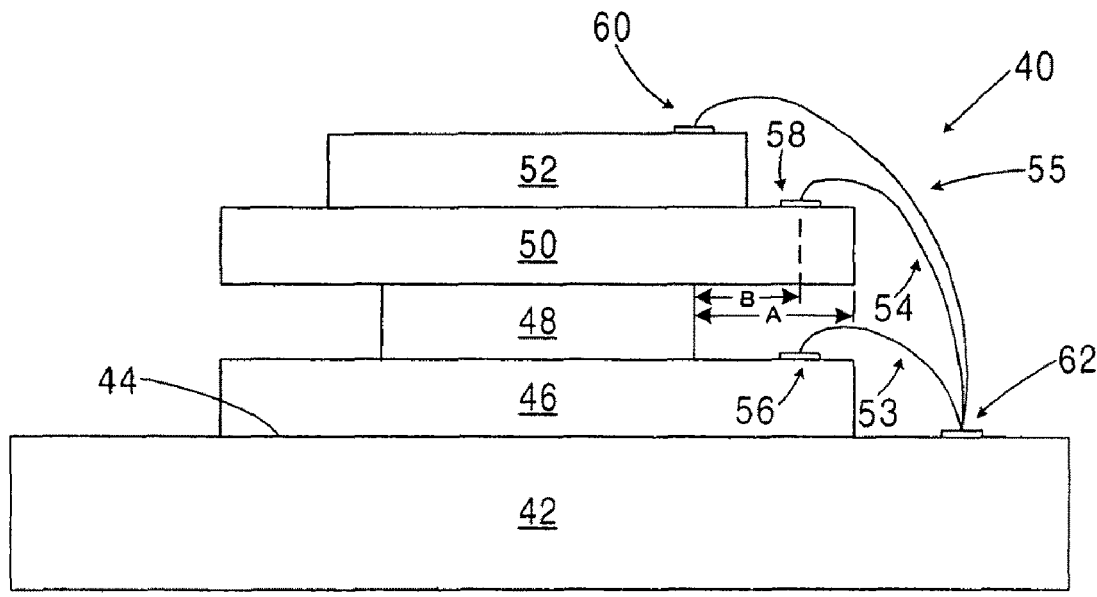
FIG. 1 illustrates an electronic device in accordance with the prior art.
Figure 2:
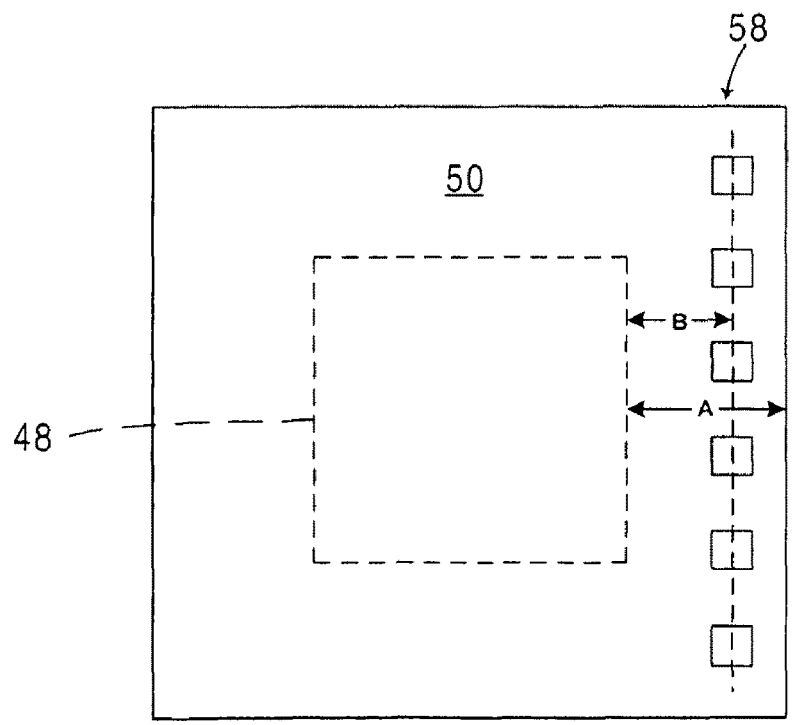
FIG. 2 is a plan view of a portion of the device of FIG. 1.
Figure 5:
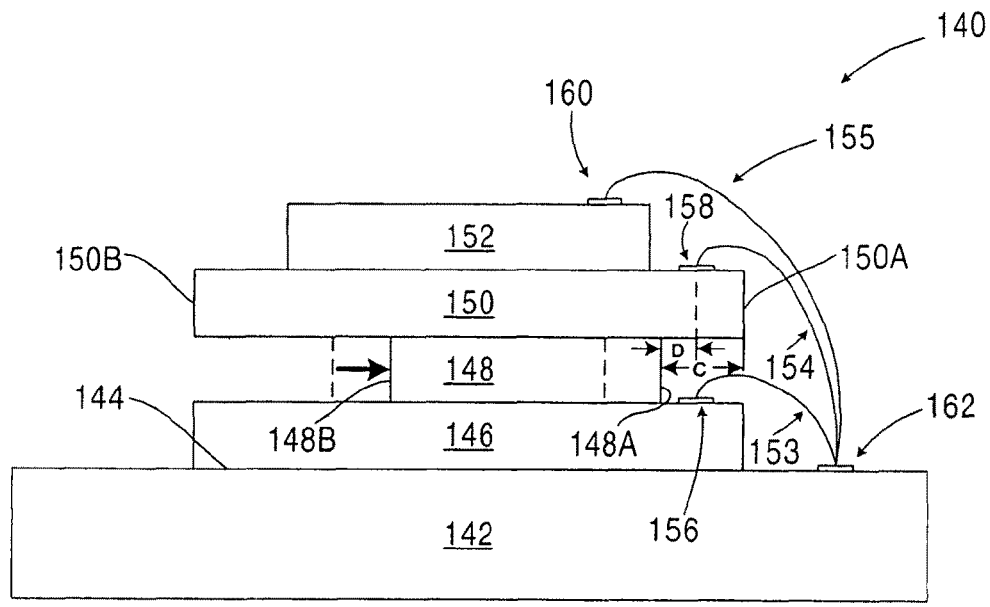
FIGS. 5 and 6 illustrate embodiments of the invention.

FIG. 5 illustrates a multi-die semiconductor device 140 (shown in simplified form), with the die in stacked relation. As shown in FIG. 1, a carrier substrate 142 has a chip attach surface 144. A semiconductor chip or die 146 is attached to the surface 144 of the substrate 142 by a die bond. A body 148 in the form of a spacer is attached to the die 146 in stacked relation by a die bond, and a semiconductor die 150 is attached to the spacer 148 in stacked relation by a die bond. The spacer 148 is thus positioned between the die 146 and the die 150. A semiconductor die 152 is attached to the die 150 in stacked relation by a die bond. The relative sizes of these elements are as in FIGS. 1 and 2. Again, the spacer 148 is of smaller dimensions than the die 146 and the die 150, with the edges of the die 150 extending beyond the respective adjacent edges of the spacer 148.

However, instead of being centered on the die 146 therebeneath and with relation to the die thereon 150, the spacer 148 is positioned in a rightward offset (arrow, FIG. 5) relative to the die 146, 150 as compared to the prior art approach so that the edge 150A of the die 150 extends beyond the respective adjacent edge 148A of the spacer 148 to a lesser extent (dimension C) than the opposite edge 150B of the die 150 extends beyond the respective adjacent edge 148B of the spacer 148. This brings the edge 148A of the spacer 148 closer to the edge 150A of the die 150, and with the bond pads 158 being mounted on the die 150 adjacent that edge 150A and on a surface of the die 150 opposite the surface thereof adjacent the spacer 148, the lever arm (dimension D) through which force is applied by the bonding head during wire bonding is reduced, decreasing bounce and vibration of the overhanging portion of the die 150 relative to the spacer 148.

The device 140 is completed by providing wires 153, 154, 155 connecting bond pads 156 on the die 146, bond pads 158 on the die 150, and bond pads 160 on the die 152 with bond pads 162 on the substrate 142 by means of conventional wire bonding. The reduced bounce described above results in improved wire bonding by providing less likelihood of faulty bonding, in turn resulting in improved yield of manufactured devices.

Figure 6:
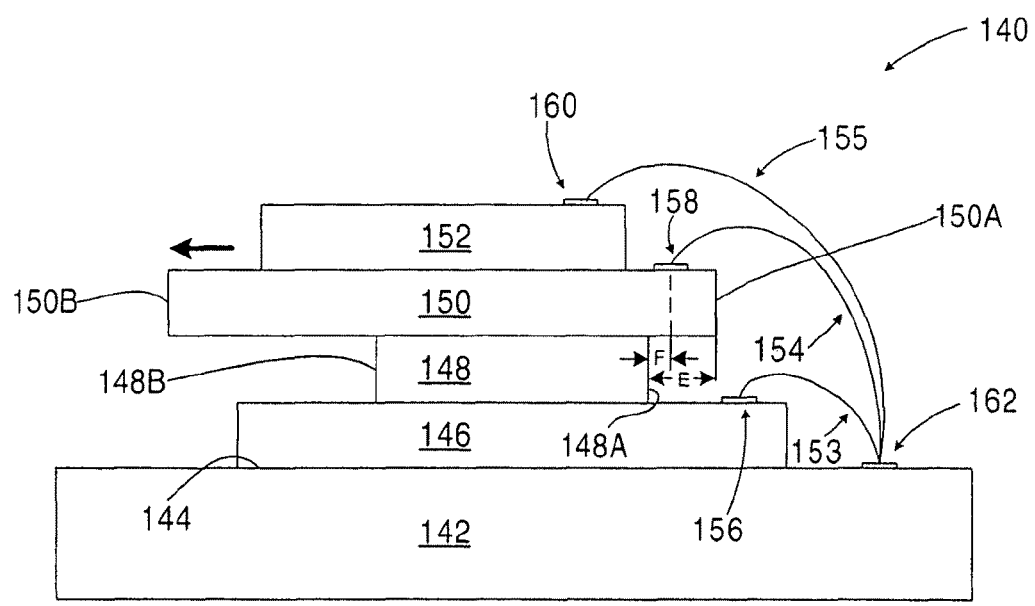

FIG. 6 illustrates a multi-die semiconductor device 140 (shown in simplified form), with the die in stacked relation. Similar to the device of FIG. 5, a carrier substrate 142 has a chip attach surface 144. A semiconductor chip or die 146 is attached to the surface 144 of the substrate 142. A body 148 in the form of a spacer is attached to the die 146 in stacked relation by a die bond, and a semiconductor die 150 is attached to the spacer 148 in stacked relation by a die bond. The spacer 148 is thus positioned between the die 146 and the die 150. A semiconductor die 152 is attached to the die 150 in stacked relation by a die bond. The relative sizes of these elements are as in FIGS. 1 and 2. Again, the spacer 148 is of smaller dimensions than the die 146 and the die 150, with the edges of the die 150 extending beyond the respective adjacent edges of the spacer 148.

In this embodiment, instead of being centered on the spacer 148 therebeneath, the die 150 (with the die 152 thereon) is positioned in a leftward offset (arrow, FIG. 6) relative to the spacer 148 as compared to the prior art approach so that the edge 150A of the die 150 extends beyond the respective adjacent edge 148A of the spacer 148 to a lesser extent than the opposite edge 150B of the die 150 extends beyond the respective adjacent edge 148B of the spacer 148. This again brings the edge 148A of the spacer 148 closer to the edge 150A of the die 150, and with the bond pads 158 being mounted on the die 150 adjacent that edge 150A and on a surface of the die 150 opposite the surface thereof adjacent the spacer 148, the lever arm (dimension F) through which force is applied by the bonding head during wire bonding is reduced, decreasing bounce and vibration of the overhanging portion of the die 150 relative to the spacer 148.

The device is again completed by providing wire connecting bond pads 156 on the die 146, bond pads 158 on the die 150, and bond pads 160 on the die 152 with bond pads 162 on the substrate 142 by means of conventional wire bonding. The reduced bounce described above results in improved wire bonding by providing less likelihood of faulty bonding, in turn resulting in improved yield of manufactured devices.

Figure 3:
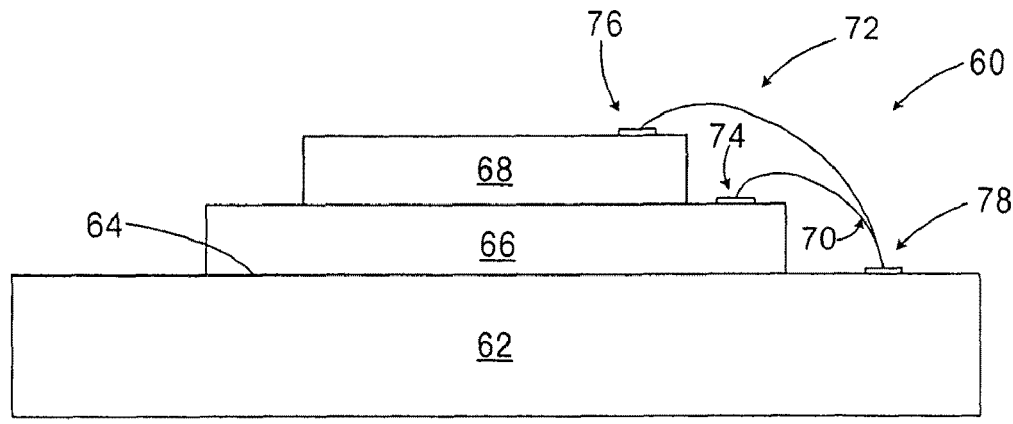
FIG. 3 illustrate another electronic device in accordance with the prior art.
Figure 4:
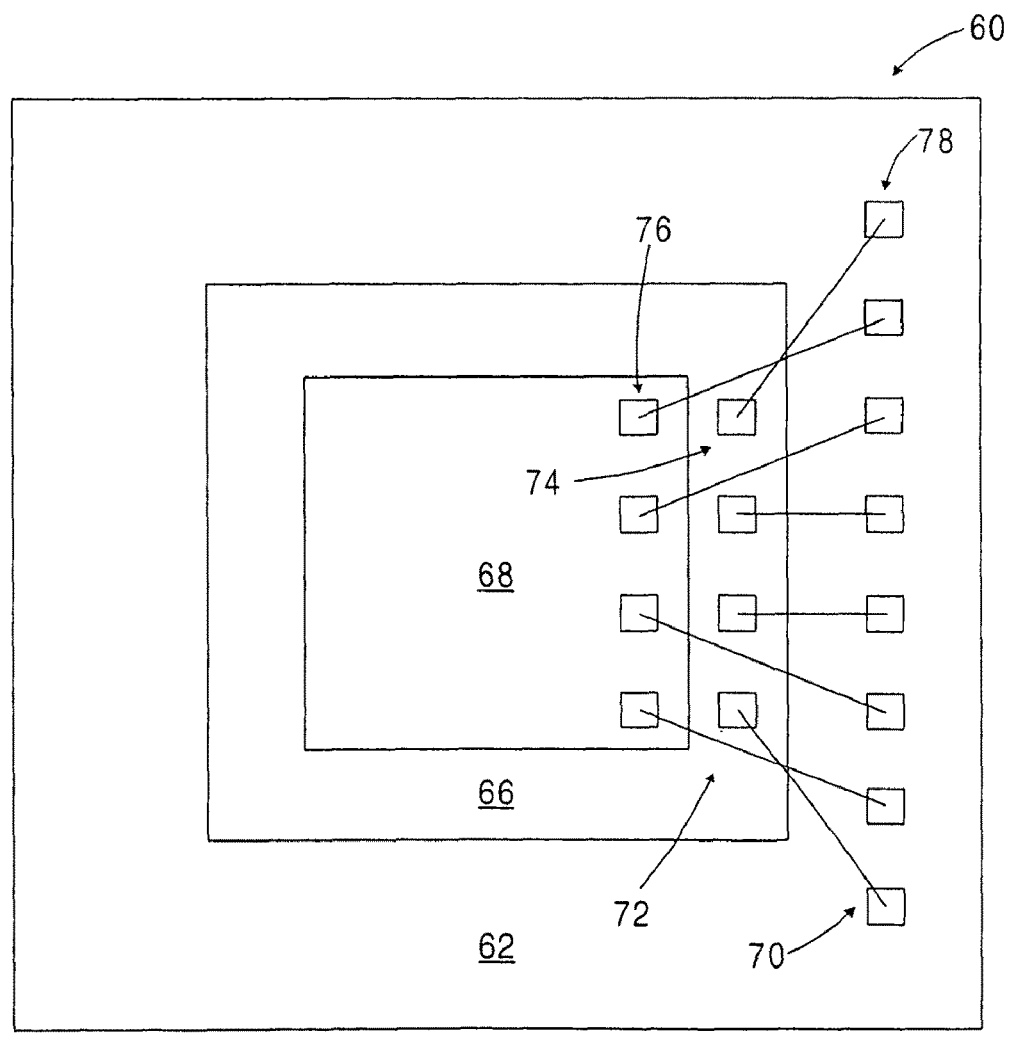
FIG. 4 is a plan view of the device of FIG. 3.
Figure 7:
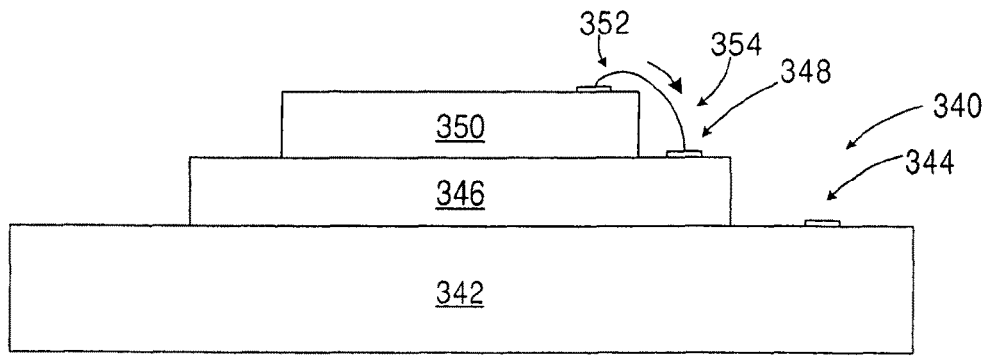
FIGS. 7-11 illustrate further embodiments of the invention.
Figure 8:
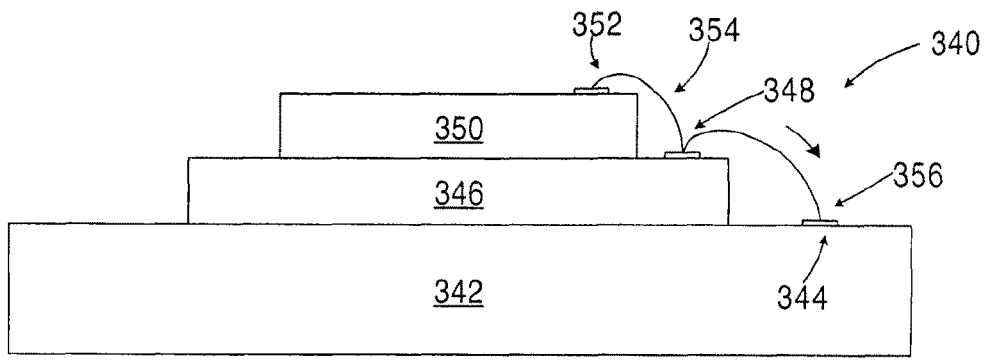
Figure 9:
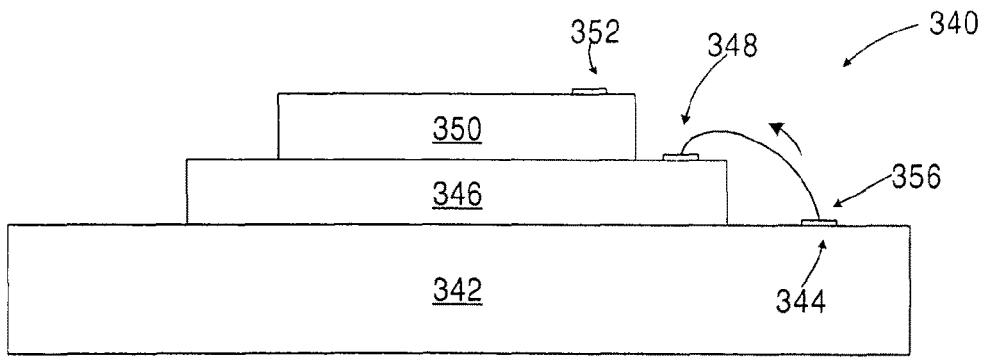
Figure 10:
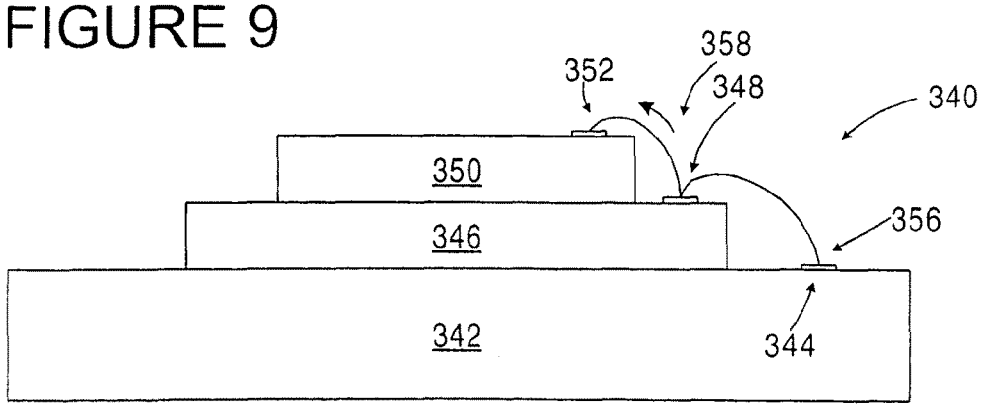
Figure 11:
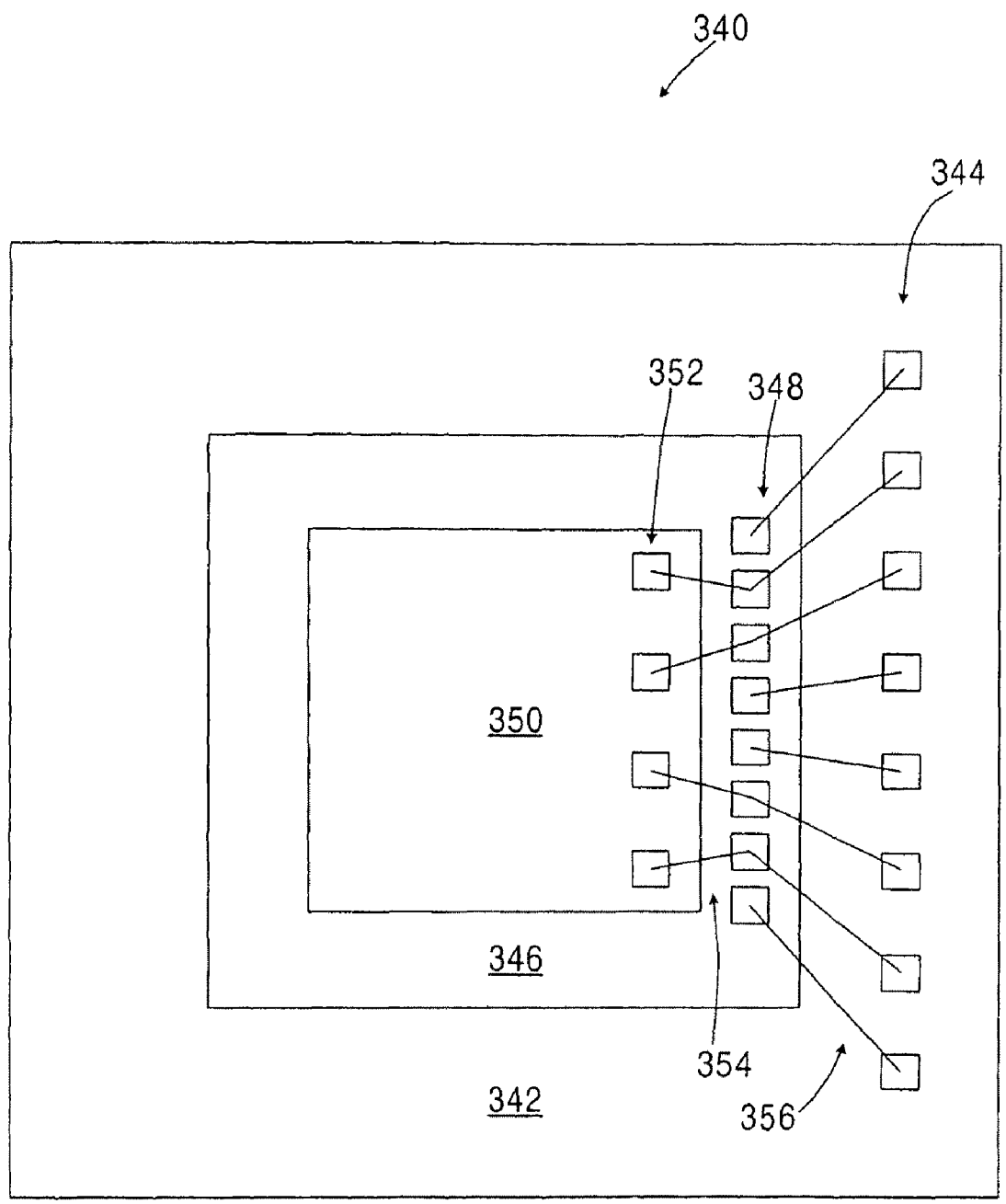

FIGS. 7-11 illustrate an approach for overcoming the problems set forth above with regard to FIGS. 3 and 4. FIG. 7 illustrates a multi-die semiconductor device 340 (shown in simplified form), with the die in stacked relation. As shown in FIGS. 8 and 11, a carrier substrate 342 has a plurality of bond pads 344 on its upper surface adjacent an edge thereof. A semiconductor chip or die 346 is attached to the substrate 342 by a die bond. This die 346 also has a plurality of bond pads 348 on its upper surface, adjacent the bond pads 344 on the substrate 342. A semiconductor die 350 is attached to the die 346 in stacked relation by a die bond. This die 350 also has a plurality of bond pads 352 on its upper surface, adjacent the bond pads 348 on the die 346 and the bond pads 344 on the substrate 342.

As shown in FIGS. 7 and 11, wire bonding is undertaken to provide wires 354 which connect bond pads 352 on the die 350 with bond pads 348 on the die 346, i.e., die-to-die connection or wire bonding. Forward wire bonding is undertaken to form these wires 354, i.e., the wires 354 are applied in the direction from the bond pads 352 on the die 350 toward the bond pads 348 on the die 346 (see arrow, FIG. 7). Next (FIG. 8), wire bonding is undertaken to provide wires 356 which connect bond pads 348 on the die 346 with bond pads 344 on the substrate 342. Forward wire bonding is undertaken to form these wires 356, i.e., the wires 356 are applied in the direction from the bond pads 348 on the substrate 346 toward the bond pads 344 on the die 342 (see arrow, FIG. 8). The wires 354, 356 are connected in the manner shown in FIG. 11, wherein each of the wires 354 connected to the bond pads 352 on the die 350 are connected to bond pads 348 on the die 346, with these wires 354 being in series with wires 356 that connect bond pads 348 on the die 346 with bond pads 344 on the substrate 342. This is to be contrasted with the prior approach wherein bond pads 76 on the die 68 are directly connected to bond pads 78 on the substrate 62. This approach provides for placement of wires as shown in FIG. 11, avoiding wire crossing which would increase likelihood of shorting and consequent failure of the device.

FIGS. 9 and 10 illustrate another approach for achieving the result of FIG. 11. In this approach, wire bonding between bond pads 348 on the die 346 and bond pads 344 on the substrate 342 is undertaken first (FIG. 9), in a reverse direction, i.e., in a direction from the bond pads 344 on the substrate 342 toward the bond pads 348 on the die 346 (see arrow, FIG. 9). Then, wire bonding is undertaken between the bond pads 352 on the die 350 and bond pads 348 on the die 346 (FIG. 10), also in the reverse direction from the bond pads 348 on the die 346 toward the bond pads 352 on the die 350 (arrow, FIG. 10. Again, the result of FIG. 11 and is achieved.

Device yield is improved by reducing the bounce and shorting problems described above.

FIG. 12 illustrates a system 400 utilizing devices as described above. As shown therein, the system 400 includes hand-held devices 402 in the form of cell phones, which communicate through an intermediate apparatus such as a tower 404 (shown) and/or a satellite. Signals are provided from one cell phone to the other through the tower 404. Such a cell phone with advantage uses devices of the type described above. One skilled in the art will readily understand the advantage of using such devices in other hand-held devices 402 such as portable media players, personal digital assistants, digital cameras and the like.

FIG. 13 illustrates another system 500 utilizing devices as described above. The system 500 includes a vehicle 502 having an engine 504 controlled by an electronic control unit 506. The electronic control unit 506 with advantage uses devices of the type described above.

Figure 14:
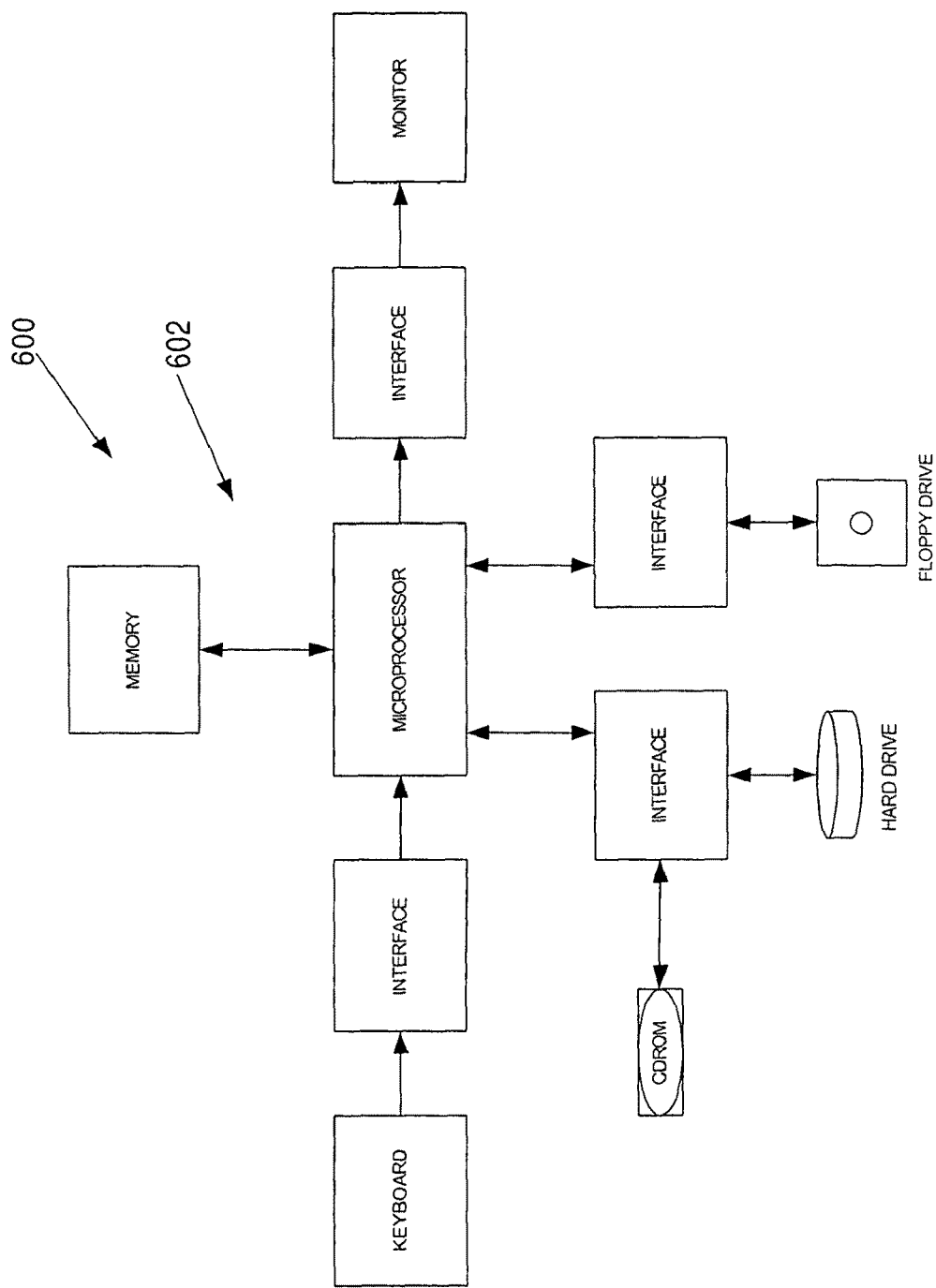

FIG. 14 illustrates yet another system 600 utilizing devices as described above. This system 600 is a computer 602 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The computer with advantage uses devices of the type described above.

The foregoing description of embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic device comprising:
    a first semiconductor integrated circuit die having a first plurality of bond pads thereon;
    a lone spacer that is offset from the center of said first integrated circuit die;
    a second semiconductor integrated circuit die having a second plurality of bond pads thereon;
    a third semiconductor integrated circuit die that is the topmost component in a stack; and
    a substrate having a third plurality of bond pads thereon wherein the first semiconductor integrated circuit die is mounted on the lone spacer, the lone spacer on the second semiconductor integrated circuit die, and the second semiconductor integrated circuit die on the substrate wherein the dimensions of the lone spacer are smaller than those of the first semiconductor integrated circuit die;
    a first plurality or wires, each connecting a bond pad on the first semiconductor integrated circuit die with a bond pad on the second semiconductor integrated circuit die; and
    a second plurality of wires, each connecting a bond pad on the second semiconductor integrated circuit die with a bond pad on the substrate.

2. The electronic device of claim 1 wherein individual wires of the first plurality of wires are connected in series with individual wires of the second plurality of wires through respective bond pads on the second semiconductor integrated circuit die.

3. The electronic device of claim 2 wherein the second semiconductor integrated circuit die lies on the substrate, and the first semiconductor integrated circuit lies on the second semiconductor integrated circuit die.

4. The device of claim 1 wherein the device is incorporated into a system.

5. The device of claim 4 wherein the system is selected from the group consisting of a hand-held device, a vehicle, and a computer.

* * * * *